United States Patent
Pyo

(10) Patent No.: US 6,849,298 B2
(45) Date of Patent: Feb. 1, 2005

(54) METHOD FOR FORMING DIFFUSION BARRIER FILM OF SEMICONDUCTOR DEVICE

(75) Inventor: Sung Gyu Pyo, Kyonggi-do (KR)

(73) Assignee: Hynix Semiconductor Inc., Kyoungki-do (KR)

(*) Notice: Subject to any disclaimer, the term of this patent is extended or adjusted under 35 U.S.C. 154(b) by 120 days.

(21) Appl. No.: 10/157,137

(22) Filed: May 30, 2002

(65) Prior Publication Data

US 2002/0187261 A1 Dec. 12, 2002

(30) Foreign Application Priority Data

Jun. 12, 2001 (KR) ..................... P 2001-32905

(51) Int. Cl.[7] .......................... C23C 16/06; C23C 16/34
(52) U.S. Cl. .............................. 427/250; 427/255.394; 427/255.7; 427/343
(58) Field of Search .................... 427/250, 255.394, 427/255.7, 343

(56) References Cited

U.S. PATENT DOCUMENTS 6,139,700 A * 10/2000 Kang et al. ............ 204/192.17
6,482,733 B2 * 11/2002 Raaijmakers et al. ....... 438/633
6,534,404 B1 * 3/2003 Danek et al. ............... 438/680
6,566,283 B1 * 5/2003 Pangrle et al. ............. 438/788
6,627,523 B2 * 9/2003 Pyo ........................... 438/584

* cited by examiner

Primary Examiner—Bret Chen
(74) Attorney, Agent, or Firm—Birch, Stewart, Kolasch & Birch, LLP.

(57) ABSTRACT

A method for forming a diffusion barrier layer of a semiconductor device by using an Atomic Layer Deposition (ALD) is disclosed, which, in a method for forming a diffusion barrier layer on an entire surface of a semiconductor substrate before forming a metal pipe connected with the semiconductor substrate through a contact hole, the contact hole being formed to expose one region of the semiconductor substrate by selectively removing an insulating interlayer on the semiconductor substrate, the method includes the steps of forming Ti/TiN layers without being exposed to the air by alternately providing a precursor set by using an atomic layer deposition (ALD) and many kinds of reacting gases, performing a silane treatment on the TiN layer, and forming a Ti thin layer by the ALD.

20 Claims, 5 Drawing Sheets

METHOD FOR FORMING DIFFUSION BARRIER FILM OF SEMICONDUCTOR DEVICE

CROSS-REFERENCES TO RELATED APPLICATIONS

This nonprovisional application claims priority under 35 U.S.C. § 119(a) on Patent Application No. 2001-32905 filed in Korea on Jun. 12, 2001, the entirety of which is herein incorporated by reference.

BACKGROUND OF THE INVENTION

1. Field of the Invention

The present invention relates to a semiconductor device, and more particularly, to a method for forming a diffusion barrier film of a semiconductor device that improves barrier characteristics.

2. Description of the Background Art

As the degree of integration of semiconductor devices increases, a copper (Cu) pipe manufacturing process inclusive of a process depositing diffusion barrier layers of titanium (Ti)/titanium nitride (TiN) layers is generally used in a pipe manufacturing process of a semiconductor device.

In the related art, the diffusion barrier layer is formed by a physical vapor deposition (PVD) or a chemical vapor deposition (CVD) process. However, the related art methods for forming diffusion barrier layers for semiconductor devices suffer several problems.

First, the diffusion barrier layer does not function appropriately as a barrier layer for the Cu pipe, thereby reducing reliability and stability of a device. In addition, recent trends in manufacturing have been aimed at processes of manufacturing highly efficient devices having a thickness of 0.1 $\mu$m or less. However, there are additional limitations encountered when minimizing the thickness of the diffusion barrier layer, thereby further degrading performance of the device.

SUMMARY OF THE INVENTION

The present invention overcomes the shortcomings associated with the background art and achieves other advantages not realized by the background art.

An object of the present invention is to provide a method for forming a barrier layer of a semiconductor device that substantially obviates one or more problems of the related art.

An object of the present invention is to provide a method for forming a barrier layer of a semiconductor device that can improve the reliability and stability of a device by forming a highly efficient barrier layer having a thin thickness.

These and other objects are accomplished by a method for forming a diffusion barrier layer on a surface of a semiconductor substrate before forming a metal pipe being connected with the semiconductor substrate through a contact hole, wherein the contact hole is formed to expose one region of the semiconductor substrate by selectively removing an insulating interlayer on the semiconductor substrate, the method comprising the steps of forming a titanium layer and a TiN layer by alternately providing a precursor material set by using an atomic layer deposition (ALD) and a plurality of reacting gases, wherein the titanium layer and the TiN layer are formed by providing the precursor material without being exposed to ambient air; performing a silane treatment on the TiN layer; and forming a thin Ti layer by the ALD.

These and other objects are further accomplished by a method for forming a diffusion barrier layer on a surface of a semiconductor substrate before forming a metal pipe being connected with the semiconductor substrate through a contact hole, wherein the contact hole is formed to expose one region of the semiconductor substrate by selectively removing an insulating interlayer on the semiconductor substrate, the method comprising the steps of forming a titanium layer and a TiN layer by alternately providing a precursor material set by using an atomic layer deposition (ALD) and a plurality of reacting gases, wherein the titanium layer is formed using hydrogen gas H2 as a reacting gas supplied to the semiconductor substrate and the TiN layer is formed using either an ammonia gas (NH3) or a mixing gas of hydrogen gas and nitrogen gas (H2+N2) as a reacting gas supplied to the semiconductor substrate; performing a silane treatment on the TiN layer; and forming a thin Ti layer by the ALD.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinafter and the accompanying drawings which are given by way of illustration only, and thus are not limitative of the present invention, and wherein.

DETAILED DESCRIPTION OF THE PREFERRED EMBODIMENTS

Figure 1:
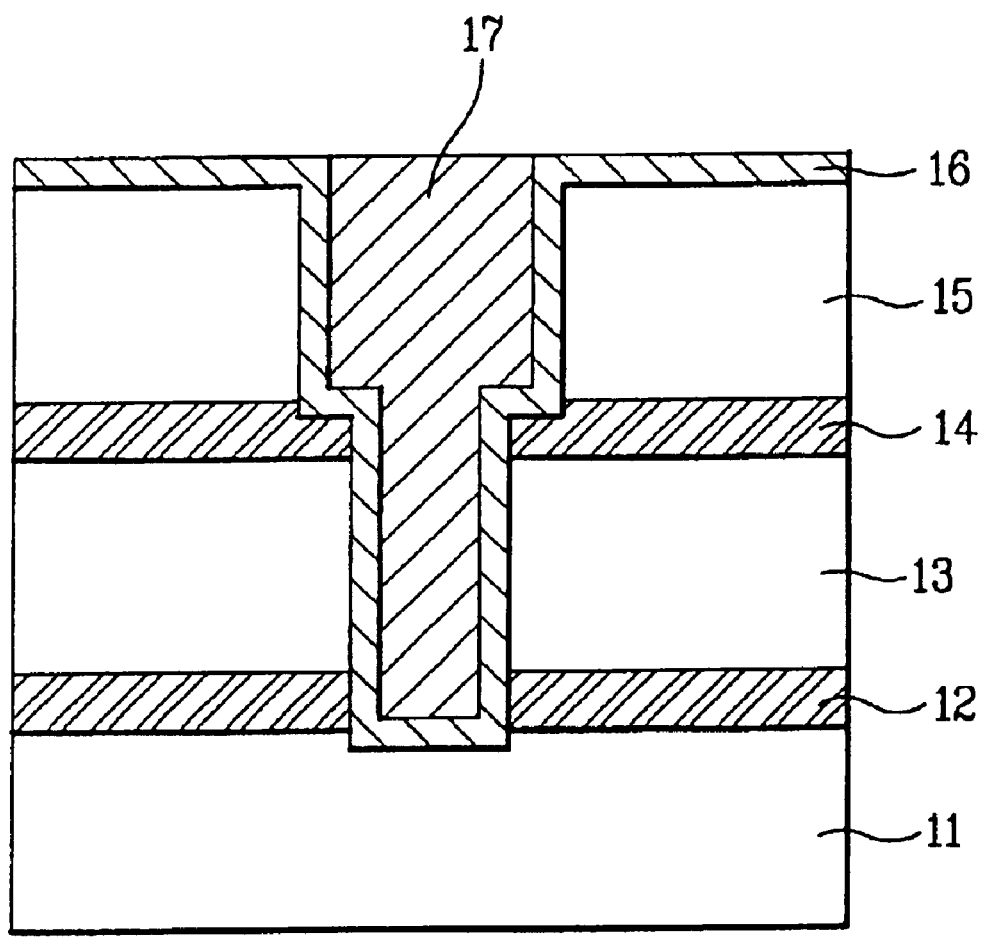
FIG. 1 is a sectional view of a pipe structure of a semiconductor device of the related art.

The present invention will hereinafter the described with reference to the accompanying drawings. FIG. 1 is a sectional view of a pipe structure of a semiconductor device of the related art. Generally, as shown in FIG. 1, a diffusion barrier layer 16 is formed of a titanium(Ti)/titanium nitride (TiN) layer on a surface of a contact hole before burying a copper (Cu) pipe 17 in the contact hole. The contact hole has a dual damascene structure (FIG. 1) or a single domasence structure formed in such a manner that first and second etch stoppers 12 and 14, and first and second insulating interlayers 13 and 15 formed on a semiconductor substrate 11 are selectively removed.

The first and second insulating interlayers 13 and 15 are formed of an oxide layer or a material having a low dielectric constant (Low-k). The first and second etch stoppers 12 and 14 are formed of a material such as a nitride layer having etch selectivity different from that of the first and second insulating interlayers 13 and 15.

Figure 2:
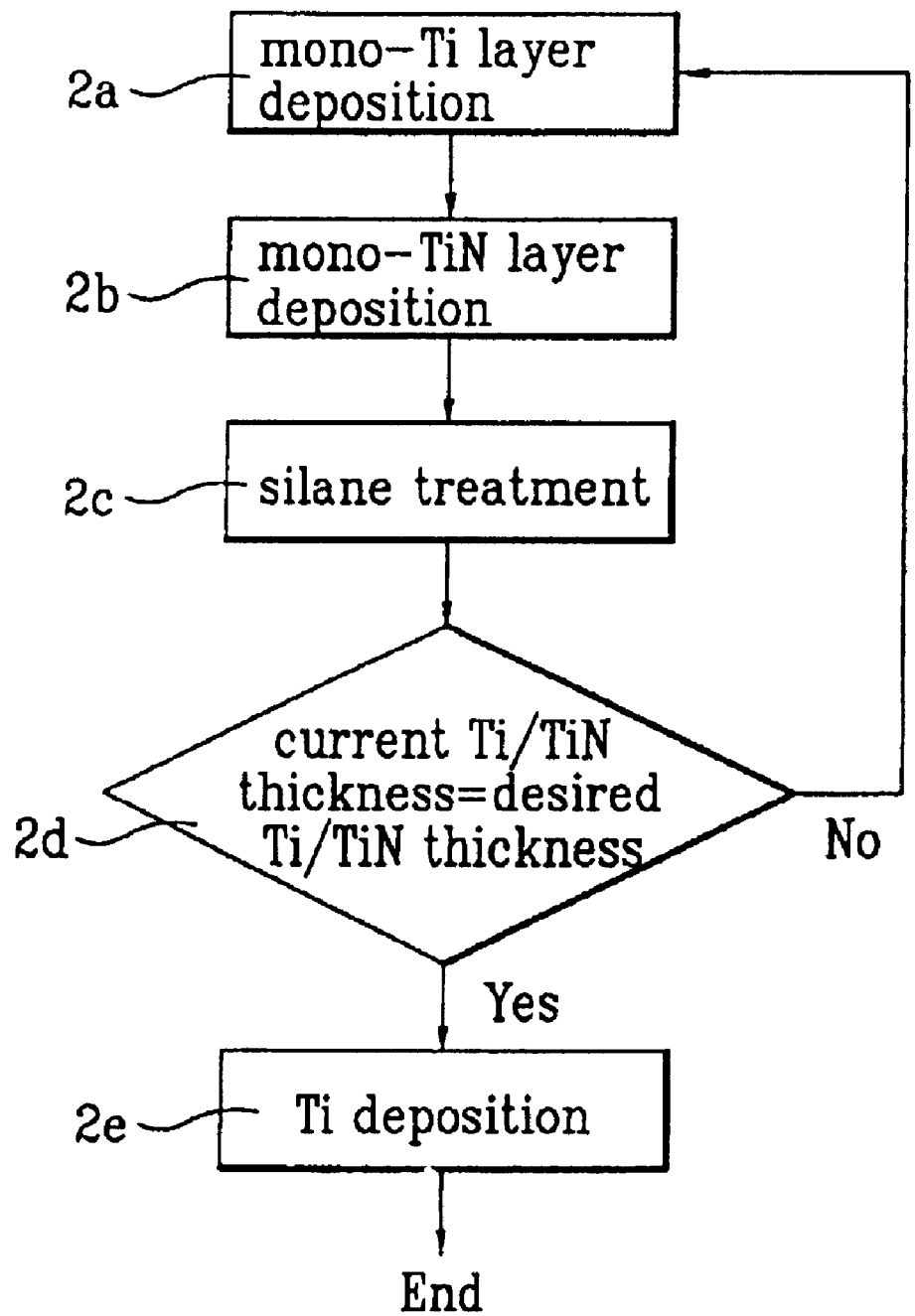
FIG. 2 is a flow chart of manufacturing process steps of a diffusion barrier layer in accordance with a first embodiment of the present invention.

FIG. 2 is a flow chart of manufacturing process steps of a diffusion barrier layer in accordance with a first embodiment of the present invention. As shown in FIG. 2, the diffusion barrier layer of the semiconductor device is formed in a cycle that includes the steps of depositing a mono-Ti layer, depositing a mono-TiN layer, and performing a silane treatment process. The cycle is repeatedly performed to form the Ti layer and the TiN layer to a desired thickness.

A method of forming the diffusion barrier layer will be described in detail hereinafter. A method for forming a diffusion barrier layer on a surface of a semiconductor substrate according to the present invention before forming a metal pipe being connected with the semiconductor substrate through a contact hole, wherein the contact hole is formed to expose one region of the semiconductor substrate by selectively removing an insulating interlayer on the semiconductor substrate may include several steps. Specifically, the method may include the steps of forming a titanium layer and a TiN layer by alternately providing a precursor material set by using an atomic layer deposition (ALD) and a plurality of reacting gases, wherein the titanium layer and the TiN layer are formed by providing the precursor material without being exposed to ambient air, performing a silane treatment on the TiN layer, and forming a thin Ti layer by the ALD.

Figure 5:
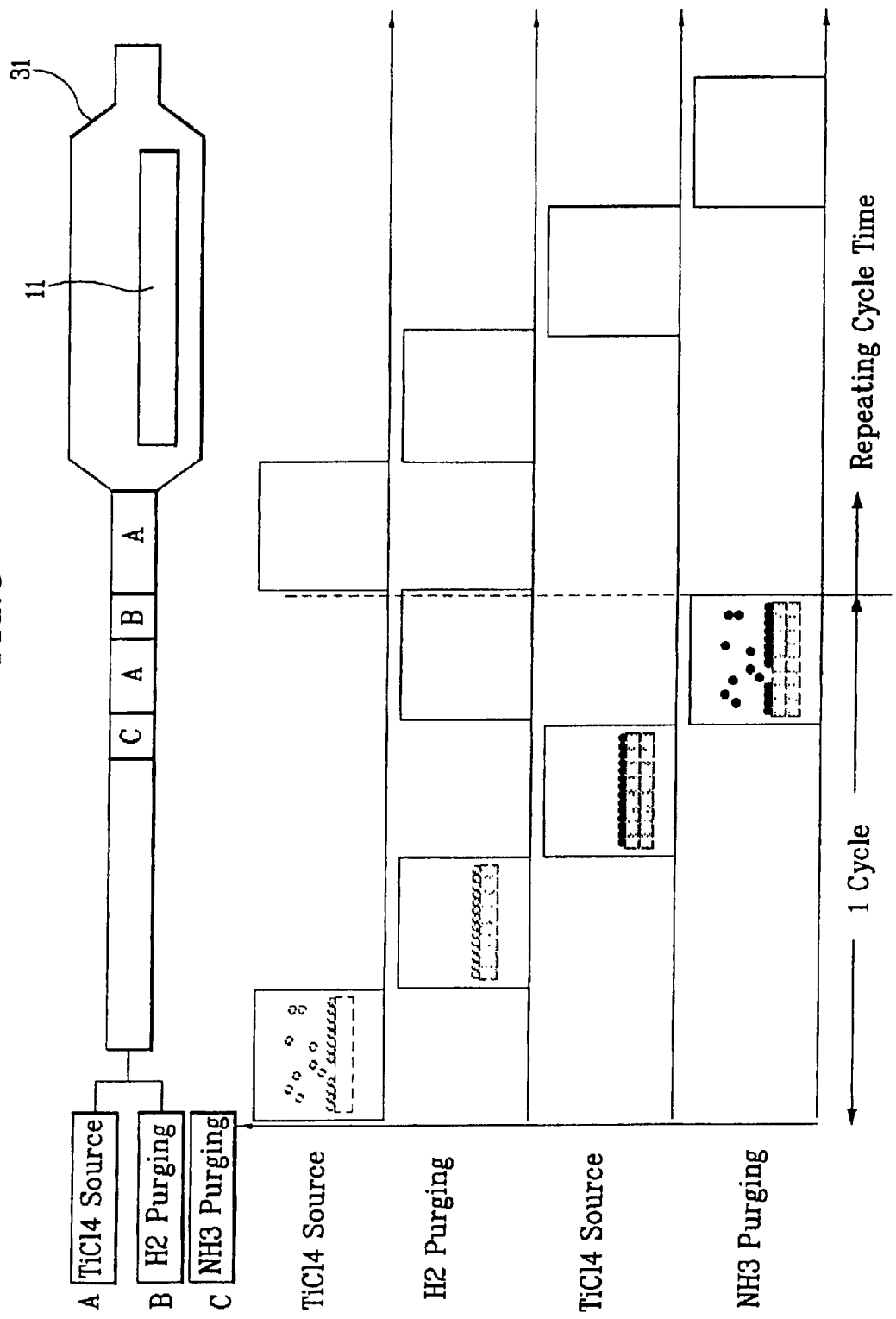
FIG. 5 shows a gas injection process within a reacting bath and manufacturing process of the diffusion barrier layer in accordance with the first embodiment of the present invention.

FIG. 5 shows a gas injection process within a reacting bath and manufacturing process of the diffusion barrier layer in accordance with the first embodiment of the present invention. As shown in FIG. 5, in order to adsorb a precursor material on the semiconductor substrate 11, $TiCl_4(A)$ flows into the semiconductor substrate 11 maintaining a temperature between 200° C. and 700° C. at a flow rate from 10 sccm to 1000 sccm for 0.1 second to 1 minute. An internal pressure of a reacting bath 51 should be maintained between 0.1 Torr and 5 Torr during the process.

Alternatively, any one of Tetrakis DiMethyl Amido Titanium (TDMAT, $Ti(N(Me_2)_4)$), Tetrakis DiEthyl Amido Titanium (TDEAT, $Ti(N(Et_2)_4)$), and Tetrakis EthylMethyl Amido Titanium (TEMAT, $Ti(N(EtMe)_4)$) may be used instead of the $TiCl_4$ as the precursor material.

In addition, argon gas Ar flows into the semiconductor substrate 11 at a flow rate from 10 sccm to 1000 sccm for 0.1 seconds to 2 minutes to remove the $TiCl_4$ that is not adsorbed on the semiconductor substrate 11. Subsequently, a reacting gas, e.g. hydrogen gas $H_2B$, flows between 10 sccm and 1000 sccm into the semiconductor substrate 11 on which the $TiCl_4$ is adsorbed. The reacting gas flows for 0.1 seconds to 1 minute to adsorb the hydrogen gas $H_2$ on the semiconductor substrate 11, thereby forming the mono-Ti layer as shown in the following formula (2a).

$$TiCl_4(g)+2H_2(g)=Ti(s)+4HCl(g) \qquad \text{(Formula 1)}$$

Then, argon gas Ar flows into the semiconductor substrate to remove the remaining Hydrogen gas $H_2$ and byproduct, chlorine gas HCl. A mono-TiN layer is then formed using either ammonia gas $NH_3$ or mixing gas of nitrogen gas $N_2$ and hydrogen gas $H_2$ instead of the hydrogen gas $H_2$. The precursor material, $TiCl_4(A)$, flows into the semiconductor substrate at a flow rate between 10 sccm and 1000 sccm for 0.1 seconds to 1 minute so that it is to be adsorbed on the mono Ti layer. Subsequently, argon gas Ar flows at a flow rate between 10 sccm and 1000 sccm for 0.1 seconds to 2 minutes to remove the $TiCl_4$ that is not adsorbed on the mono Ti layer.

Then, reacting gas, ammonia gas $NH_3(C)$, flows at a flow rate between 10 sccm and 1000 sccm for 0.1 seconds to 1 minute, thereby adsorbing the ammonia gas $NH_3$ on the mono Ti layer adsorbed with the $TiCl_4$. Accordingly, the mono TiN layer is formed as shown in the following formula (2b).

$$6TiCl_4(g)+8NH_3(g)=6TiN(s)+24HCl(g)+N_2(g) \qquad \text{(Formula 2)}$$

Next, argon gas Ar flows into the semiconductor substrate to remove the remaining ammonia gas $NH_3$ and the byproducts chlorine gas HCl and nitrogen gas $N_2$.

The ammonia gas $NH_3$ flows through a hydrogen gas pipe, or a separate ammonia gas pipe installed within the apparatus. In the case of installing a separate ammonia gas pipe, the hydrogen gas $H_2$ used in depositing the Ti layer through the hydrogen gas pipe is also used in depositing the TiN layer. At the same time, the ammonia gas $NH_3$ flows through the ammonia gas pipe so that reacting gas can easily be adjusted. In such case, reacting mechanism is shown in following formula (3).

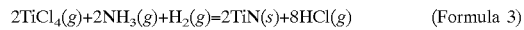

$$2TiCl_4(g)+2NH_3(g)+H_2(g)=2TiN(s)+8HCl(g) \qquad \text{(Formula 3)}$$

When injecting the gases into the reacting bath, the gases have to be injected in parallel with the semiconductor substrate. At this time, the semiconductor substrate revolves at a speed between 10 rpm and 500 rpm, thereby equally adsorbing the gases on the semiconductor substrate for a desired time. In addition, a silane treatment is performed on a surface of the mono-TiN layer to improve the adhesion to a Cu pipe and barrier characteristics. (2c)

A cycle that includes the steps of depositing the mono-Ti layer 2a, depositing the mono-TiN layer 2b, and performing the silane treatment 2c is repeatedly performed 5 to 2000 times to respectively form a total thickness of the mono-Ti layers and the mono-TiN layers of 10 to 500 Å and 10 to 600 Å. (2d). Next, the Ti layer is formed by a process for depositing the mono-titanium layer on the TiN layer performed by the silane treatment. Accordingly, a diffusion barrier layer is obtained in accordance with the first embodiment of the present invention. (2e)

Figure 3:
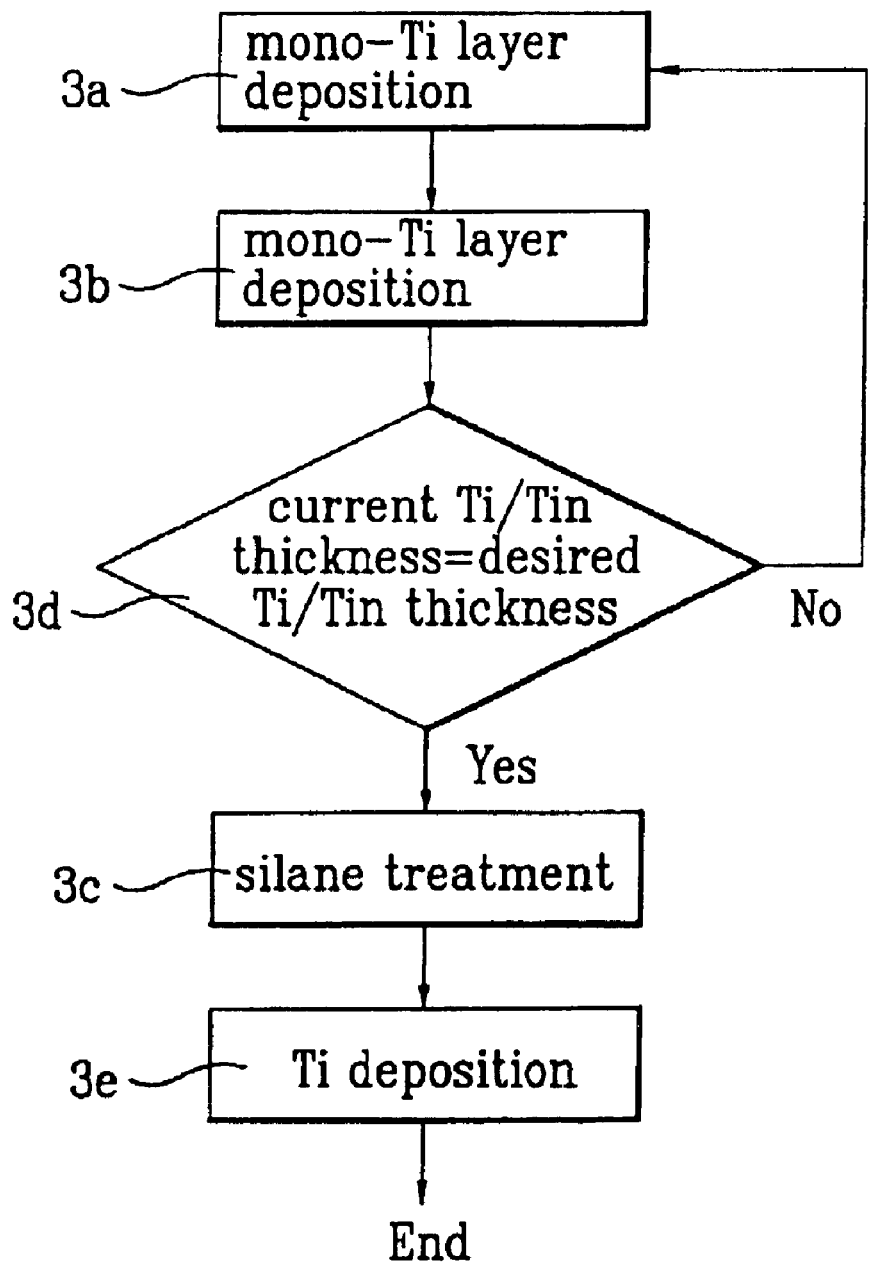
FIG. 3 is a flow chart of manufacturing process steps of a diffusion barrier layer in accordance with a second embodiment of the present invention.

As shown in FIG. 3, a method for forming a diffusion barrier layer according to a second embodiment of the present invention includes the steps of depositing a mono-titanium layer (3a), and depositing a mono-TiN layer (3b). The mono-titanium (3a) and mono-TiN (3b) layers are deposited with a method identical to the method used in the first above-described embodiment.

A cycle that includes the steps of depositing the mono-titanium layer (3a) and depositing the mono-TiN layer (3b) is repeatedly performed 5 to 2000 times thereby to respectively form a total thickness of the mono-Ti layers and the mono-TiN layers of 10 to 500 Å and 10 to 600 Å (3c). The silane treatment is subsequently performed on the titanium layer (3d), and the mono-titanium layer is then deposited on an upper portion of the titanium layer (3e). Accordingly, the diffusion barrier layer is completed according to the second embodiment of the present invention.

Figure 4:
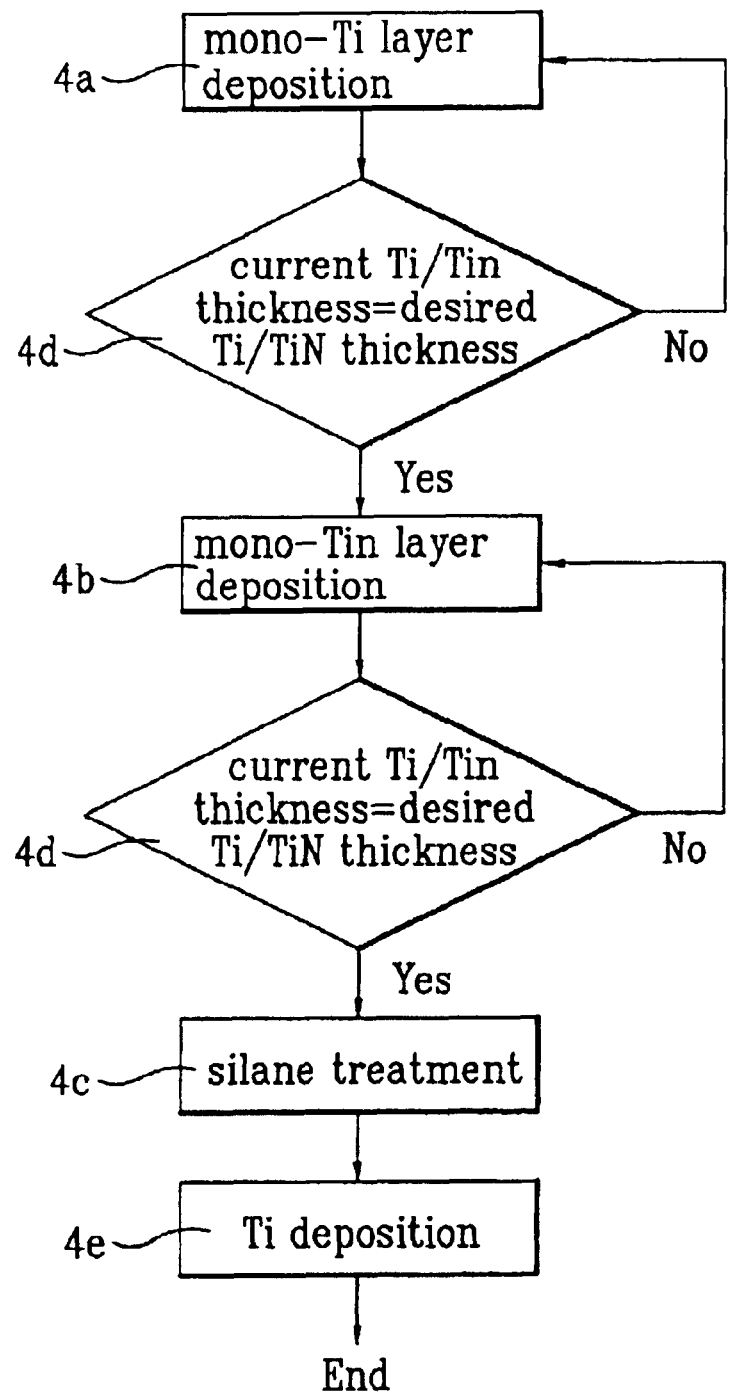
FIG. 4 is a flow chart of manufacturing process steps of a diffusion barrier layer in accordance with a third embodiment of the present invention.

As shown in FIG. 4, in a method for forming a diffusion barrier layer of a semiconductor device according to the third embodiment of the present invention, mono-Ti layers are deposited on a semiconductor substrate 11 between 5 to 2000 times so as to form a thickness of 10 to 500 Å (4a)(4b). Subsequently, mono-TiN layers are deposited on the titanium layer having a desired thickness between 5 times to 2000 times to form a thickness 10 to 600 Å (4c)(4d).

A method for depositing the mono-Ti and mono-TiN layers is identical to the method for depositing mono-Ti and mono-TiN layers according to the first embodiment. Next, the silane treatment is performed on the TiN layer (4e), and then the mono-titanium layer is deposited (4f). Accordingly, the diffusion barrier layer according to the third embodiment is completed.

The method for forming the diffusion barrier layer of the semiconductor device according to the present invention has following advantages. First, barrier characteristics of the diffusion barrier layer and adhesion of the diffusion barrier layer to a Cu pipe can be improved through the silane treatment.

Furthermore, the thickness and structure of the diffusion barrier layer can be precisely controlled so that in case of highly efficient devices having a thickness of 0.1 μm or less, reliability and characteristic of the device can be improved. One of skill in the art will appreciate that the present invention can be readily applied to other types of apparatuses.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method for forming a diffusion barrier layer on a surface of a semiconductor substrate before forming a metal pipe being connected with the semiconductor substrate through a contact hole, wherein the contact hole is formed to expose one region of the semiconductor substrate by selectively removing an insulating interlayer on the semiconductor substrate, the method comprising the steps of:
   forming a titanium layer and a TiN layer by alternately providing a precursor material set by using an atomic layer deposition (ALD) and a plurality of reacting gases, wherein the titanium layer and the TiN layer are alternately formed by providing the precursor material without being exposed to ambient air;
   performing a silane treatment on the TiN layer; and
   forming a thin Ti layer by the ALD.

2. The method according to claim 1, wherein the titanium layer is formed using hydrogen gas $H_2$ as a reacting gas supplied to the semiconductor substrate at a flow rate between 10 sccm and 1000 sccm for 0.1 seconds to 1 minute.

3. The method according to claim 1, wherein the TiN layer is formed using either an ammonia gas ($NH_3$) or a mixing gas of hydrogen gas and nitrogen gas ($H_2+N_2$) as a reacting gas supplied to the semiconductor substrate at a flow rate between 10 sccm and 1000 sccm for 0.1 seconds to 1 minute.

4. The method according to claim 1, wherein the precursor material is formed of any one of $TiCl_4$, Tetrakis DiMethyl Amido Titanium (TDMAT, $Ti(N(Me_2)_4)$), Tetrakis DiEthyl Amido Titanium (TDEAT, $Ti(N(Et_2)_4)$), and Tetrakis EthylMethyl Amido Titanium (TEMAT, $Ti(N(EtMe)_4)$), and the precursor flows into the semiconductor substrate at a flow rate between 10 sccm and 1000 sccm for 0.1 second to 1 minute.

5. The method according to claim 1, wherein the insulating interlayers are formed of an oxide layer or a material having a low dielectric constant.

6. The method according to claim 1, wherein the contact hole has a dual damascene structure or a single damascene structure.

7. The method according to claim 1, wherein a temperature of the semiconductor substrate is maintained between 200° C. and 700° C. during the process.

8. The method according to claim 1, wherein an internal pressure of a reacting bath is maintained between 0.1 Torr and 5 Torr during the process.

9. The method according to claim 1, further comprising flowing argon gas Ar at a flow rate between 10 sccm and 1000 sccm for 0.1 seconds to 2 minutes to remove the precursor material or the reacting gases that are not adsorbed on the semiconductor substrate after absorbing the precursor material or the reacting gases on the semiconductor substrate.

10. The method according to claim 1, wherein the titanium and TiN layers are formed by repeatedly performing a cycle that includes the steps of depositing an ALD titanium layer, depositing an ALD TiN layer, and performing a silane treatment on the ALD TiN layer to form the titanium and TiN layers at a desired thickness.

11. The method according to claim 1, wherein the titanium and TiN layers are formed by repeatedly performing a cycle that includes the steps of depositing an ALD Ti layer, and depositing an ALD TiN layer to form the titanium and TiN layers at a desired thickness.

12. The method according to claim 1, wherein the titanium and TiN layers are formed by the steps of:
   forming the titanium layer having the desired thickness by repeatedly performing the ALD titanium depositing process, and
   forming the TiN layer having the desired thickness by repeatedly performing the ALD TiN depositing process.

13. The method according to claim 1, wherein the ALD Ti depositing process is repeatedly performed 5 to 2000 times to form the titanium layer at a thickness of between 10 to 500 Å.

14. The method according to claim 1, wherein the ALD TiN depositing process is repeatedly performed 5 to 2000 times to form the TiN layer at a thickness of between 10 to 600 Å.

15. The method according to claim 1, wherein the semiconductor substrate revolves at a speed between 10 rpm and 500 rpm during said forming of the titanium and TiN layers.

16. The method according to claim 1, wherein the reacting gas to the TiN layer and the reacting gas to the Ti layer are provided at the same time during the process of forming the TiN layer, in which the reacting gas to the Ti layer is provided through a gas pipe different than a gas pipe for providing the reacting gas to the TiN layer.

17. The method according to claim 1, wherein the ammonia gas ($NH_3$) flows through a hydrogen gas pipe, or a separate ammonia gas pipe installed within an apparatus.

18. A method for forming a diffusion barrier layer on a surface of a semiconductor substrate before forming a metal pipe being connected with the semiconductor substrate through a contact hole, wherein the contact hole is formed to expose one region of the semiconductor substrate by selectively removing an insulating interlayer on the semiconductor substrate, the method comprising the steps of:
   forming a titanium layer and a TiN layer by alternately providing a precursor material set by using an atomic layer deposition (ALD) and a plurality of reacting gases, wherein the titanium layer is formed using hydrogen gas $H_2$ as a reacting gas supplied to the semiconductor substrate and the TiN layer is formed using either an ammonia gas ($NH_3$) or a mixing gas of hydrogen gas and nitrogen gas ($H_2+N_2$) as a reacting gas supplied to the semiconductor substrate, and the titanium layer and the TiN layer are alternately formed to have a desired thickness;
   performing a silane treatment on the TiN layer; and
   forming a thin Ti layer by the ALD.

19. The method according to claim 18, wherein the reacting gases are supplied to the semiconductor substrate at a flow rate between 10 sccm and 1000 sccm for 0.1 seconds to 1 minute.

20. The method according to claim 19, wherein the precursor material is formed of any one of $TiCl_4$, Tetrakis DiMethyl Amido Titanium (TDMAT, $Ti(N(Me_2)_4)$), Tetrakis DiEthyl Amido Titanium (TDEAT, $Ti(N(Et_2)_4)$), and Tetrakis EthylMethyl Amido Titanium (TEMAT, $Ti(N(EtMe)_4)$), and the precursor flows into the semiconductor substrate at a flow rate between 10 sccm and 1000 sccm for 0.1 second to 1 minute.

* * * * *